(12) United States Patent
Chen

(10) Patent No.: US 6,612,475 B2
(45) Date of Patent: Sep. 2, 2003

(54) TAPE SHIFTING MEANS

(75) Inventor: Cheng-Ming Chen, Kaohsiung (TW)

(73) Assignee: Hannstar Display Corporation, Taipei (TW)

( * ) Notice: Subject to any disclaimer, the term of this patent is extended or adjusted under 35 U.S.C. 154(b) by 57 days.

(21) Appl. No.: 09/976,760

(22) Filed: Oct. 12, 2001

(65) Prior Publication Data

US 2002/0153403 A1 Oct. 24, 2002

(30) Foreign Application Priority Data

Apr. 19, 2001 (TW) .................................. 90109366 A

(51) Int. Cl.[7] .................. B65H 20/00; B65H 20/24; B44C 7/06
(52) U.S. Cl. .................. 226/126; 226/112; 156/576; 156/581; 271/84
(58) Field of Search ............................. 226/112, 126, 226/128, 96, 173; 156/289, 290, 553, 572, 576, 581; 271/82, 84, 85, 204; 294/119.1, 902; 269/269

(56) References Cited

U.S. PATENT DOCUMENTS

| | | | | |
|---|---|---|---|---|
| 2,821,775 A | * | 2/1958 | Pevelka | 269/269 |
| 3,737,368 A | * | 6/1973 | Such et al. | 156/290 |
| 4,586,317 A | * | 5/1986 | Bussell | 156/581 |
| 4,624,726 A | * | 11/1986 | Harper, Jr. | 226/173 |
| 5,096,527 A | * | 3/1992 | Biagiotti | 156/553 |
| 5,190,612 A | * | 3/1993 | Orlandi | 156/572 |
| 5,287,637 A | * | 2/1994 | Dixit et al. | 226/173 |
| 5,667,625 A | * | 9/1997 | Alikhan | 156/553 |
| 2002/0129886 A1 | * | 9/2002 | Kerr | 156/581 |

\* cited by examiner

*Primary Examiner*—Michael R. Mansen
(74) *Attorney, Agent, or Firm*—J.C. Patents

(57) ABSTRACT

A shifting device for fixing and conveying a tape comprises a first head having a first surface to contact with a top of the tape, and a second head having a second surface to contact with a bottom of the tape. The first surface has a plurality of first strip-shaped projections thereon, and the second surface has a plurality of second strip-shaped projections thereon, such that the top surface of first striped-shaped projection is parallel to the first surface and the top surface of the second strip-shaped projection is parallel to the second surface. When the first head and the second head come into contact with the tape, the first strip-shaped projection is perpendicular to the second strip-shaped projection such that pressed regions of the tape which are pressed by both the first head and the second head are distributed in an array.

4 Claims, 3 Drawing Sheets

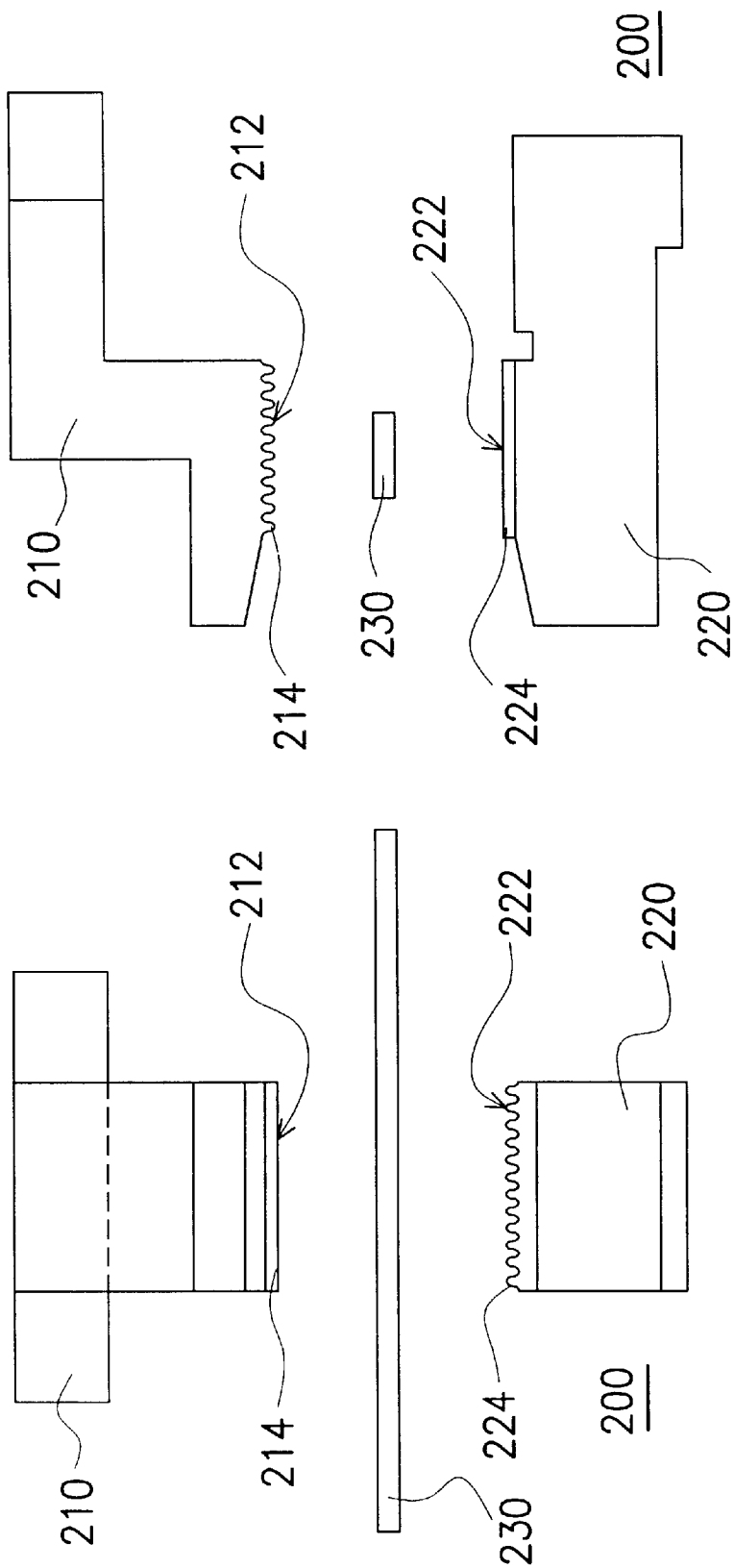

TAPE SHIFTING MEANS

CROSS-REFERENCE TO RELATED APPLICATION

This application claims the priority benefit of Taiwan application serial no. 90109366, filed Apr. 19, 2001.

BACKGROUND OF THE INVENTION

1. Field of the Invention

The present invention relates to a tape shifting means. More specifically, the present invention relates to a tape shifting means which changes the way to contact the heads of the shifting means with tape in order to decrease the amount of film left on the head.

2. Description of the Related Art

Liquid crystal was found by Reinitzer, who was an Austrian plant researcher, in 1888. Attempts to develop liquid crystal as a material for a display device have been made since transparent liquid crystal was found to turn opaque if an electric field is applied. A liquid crystal display (LCD) has various superior advantages, such as non-radiation and low driving voltage, and can be used in related electronic products, such as a notebook computer or a liquid crystal television. However, a plurality of driving chips with tape carrier packages (TCPs) need to be provided around the LCD to electrically connect the chips to the LCD. For TCP, a carrier is provided to support a plurality of inner leads for electrically connecting to the driving chips and a plurality of outer leads for electrically connecting to the LCD. There are various ways to connect the outer leads to the LCD, including welding or anisotropic conductive film attachment. The anisotropic conductive film is a resin having conductive fine powders distributed therein. The conductive fine powders can be formed of materials such as nickel, solder or carbon. When the outer leads are connected to the LCD by an anisotropic conductive film attachment, the anisotropic conductive film is pressed on contacts of the liquid crystal sheet and heated until the anisotropic conductive film is melted. Then, the anisotropic conductive film is pressed against the outer leads. With the conductive powders distributed in the anisotropic conductive film, the outer leads can be electrically connected to the connections.

FIG. 1 is a schematic view showing a conventional anisotropic conductive film. The anisotropic conductive film 20 is carried by a tape 30, with the bottom surface 32 of the tape 30 keeping contact with the anisotropic conductive film 20. The tape 30 is conveyed forward by a shifting means 40. A cutter (not shown) is used to partly cut the anisotropic conductive film 20 into a plurality of sections that are not discrete. Each of the sections can match the connections on the liquid crystal sheet 60. When the section of the anisotropic conductive film 20 are above the connections on the liquid crystal sheet, a pressing member 50 presses the anisotropic conductive film 20 down to bond the anisotropic conductive film 20 to the connection and leave the non-bonded portion of the anisotropic film 20 on the tape 30. Then, the pressing member 50 is removed. The portion of the remained anisotropic film 20 goes forward with the tape 30 for a predetermined distance by the shifting means 40 and winds around a reel (not shown).

FIG. 2 is a front view of a conventional tape shifting means. FIG. 3 is a side view of the conventional tape shifting means of FIG. 2.

With reference to FIGS. 2 and 3, a shifting means 100 includes a first head 110 and a second head 120. The first head 110 has a first surface 112 to contact with a tape 130. The second head 120 has a second surface to contact with the tape 130.

When the shifting means clamps the tape 130, the anisotropic conductive film remained on the tape 130 can adhere to the second surface 122 of the second head 120. Even though the second surface 122 has a Teflon coating thereon, it cannot effectively prevent the anisotropic conductive film from adhering to the second surface 122. Furthermore, the Teflon coating on the second surface 122 would be damaged after it is used for a certain period, and a new shifting means is needed. If the shifting means having a damaged surface is not replaced, a poor yield is obtained.

SUMMARY OF THE INVENTION

In one aspect of the present invention, a tape shifting means is provided, in which the tape shifting means changes the way to contact heads of the shifting means with tape to decrease the amount of film left on the head.

In order to achieve the above and other objects of the present invention, a tape shifting means is provided, in which the tape shifting means can convey a tape carrying the conductive film and separate an anisotropic conductive film from the tape. The shifting means includes a first head having a first surface and a second head having a second surface. The first head contacts with the top of the tape by the first surface of the first head. The second head contacts with the bottom of the tape by the second surface of the second head. The first surface is further provided with a plurality of first projections thereon The second surface is further provided with a plurality of second projections. All of the first projections and the second projections can be shaped into strips, such that the top surface of the first projection is parallel to the first surface and the top surface of the second projection is parallel to the second surface. When the first head and the second head come into contact with the tape, the first projection is perpendicular to the second projection such that pressed regions of the tape which are pressed by both the first head and the second head are distributed in an array.

In the present invention, the shifting means changes the way to contact the heads of the shifting means with tape to decrease the amount of film left on the head. Therefore, the contact area between the second surface and the tape is reduced greatly and the amount of the anisotropic conductive film which is left on the second surface thus can be decreased, thereby increasing the yield and the service life of the shifting means.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

FIG. 4 is a front view of an anisotropic conductive film shifting means according to one preferred embodiment of the present invention; and FIG. 5 is a side view of the anisotropic conductive film shifting means of FIG. 4.

DESCRIPTION OF THE PREFERRED EMBODIMENT

Figure 1:
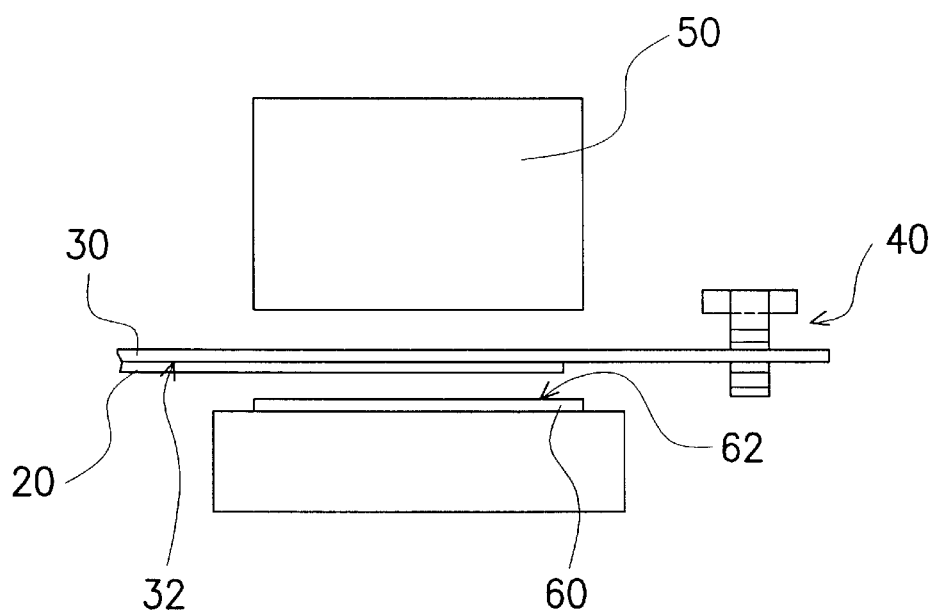
FIG. 1 is a schematic view showing a conventional anisotropic conductive film.
Figure 3:
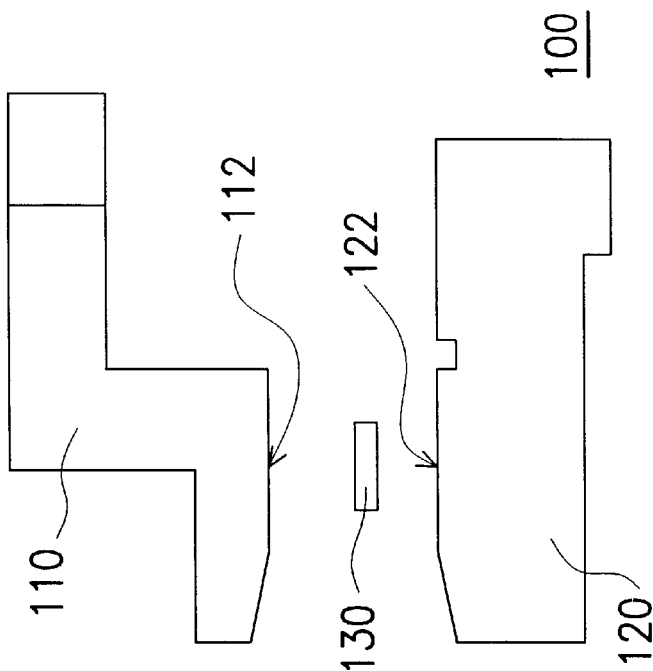
FIG. 3 is a side view of the conventional tape shifting means of FIG. 2.
Figure 2:
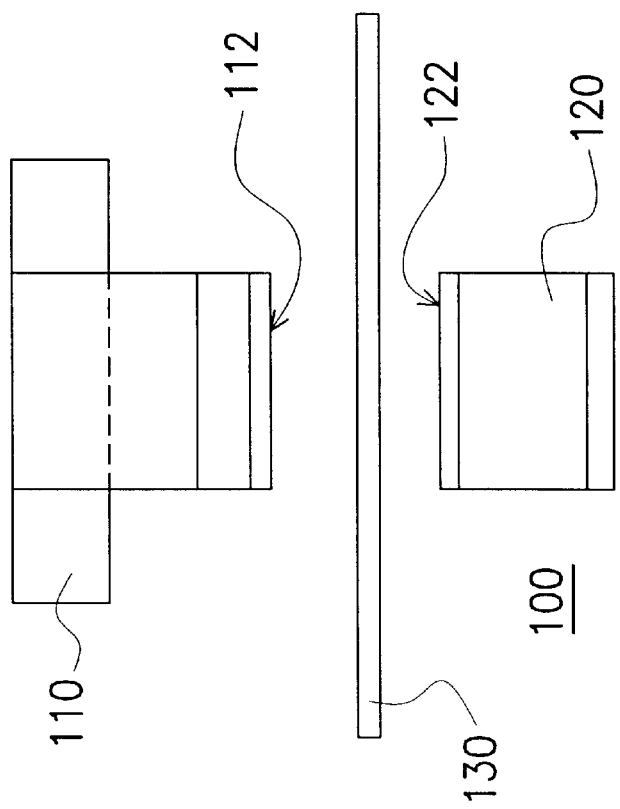
FIG. 2 is a front view of a conventional tape shifting means.

With reference to FIGS. 4 and 5, a shifting means 200 includes a first head 210 having a first surface 212 and a second head 220 having a second surface 222. A tape 230 can be clamped by the first surface 212 of the first head 210 and the second surface 222 of the second head 220.

The first surface 212 is further provided with a plurality of first projections 214 thereon. The second surface 222 is further provided with a plurality of second projections 224. All of the first projections and the second projections can be shaped into strips, such that the top surface of first projection is parallel to the first surface and the top surface of the second projection is parallel to the second surface. When the first head 210 and the second head 220 come into contact with the tape 230, the first projection 214 is perpendicular to the second projection 224, such that pressed regions of the tape which are pressed by both the first head 210 and the second head 220 are distributed in an array.

In the present invention, the shifting means 200 clamps the tape 230 by the first head 210 and the second head 220 in a way such that pressed regions of the tape which are pressed by both the first head 210 and the second head 220 are distributed in an array. Therefore, the contact area between the second surface 222 and the tape 230 is reduced greatly, and the amount of the anisotropic conductive film which is left on the second surface 222 thus can be decreased, thereby increasing the yield and the service life of the shifting means.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A shifting means for fixing and conveying a tape, the shifting means comprising:

a first head having a first surface to contact with a top of the tape;

a second head having a second surface to contact with a bottom of the tape;

wherein the first surface has a plurality of first strip-shaped projections thereon and the second surface has a plurality of second strip-shaped projections thereon, such tat the top surface of first striped-shaped projection is parallel to the first surface and the top surface of the second strip-shaped projection is parallel to the second surface, and wherein when the first head and the second head come into contact with the tape, the first strip-shaped projection is perpendicular to the second strip-shaped projection such that pressed regions of the tape which are pressed by both the first head and the second head are distributed in an array.

2. A shifting means for fixing and conveying a tape, the shifting means comprising:

a first head having a first surface which has a plurality of first projections thereon to contact with a top of the tape;

a second head having a second surface which has a plurality of second projections thereon to contact with a bottom of the tape, wherein each of the first and second projections are formed into strips and the top surface of the first projection is parallel to the first surface and the top surface of the second projection is parallel to the second surface.

3. The shifting means of claim 2, wherein when the first head and the second head come into contact with the tape, each of the first projection is perpendicular to the second projection such that pressed regions of the tape which are pressed by both the first head and the second head are distributed in an array.

4. A shifting means for fixing and conveying a tape, the shifting means comprising:

a first head having a first surface which has a plurality of first projections thereon to contact with a top of the tape;

a second head having a second surface which has a plurality of second projections thereon to contact with a bottom of the tape, wherein when the first head and the second head come into contact with the tape, each of the first projection is perpendicular to the second projection such that pressed regions of the tape which are pressed by both the first head and the second head are distributed in an array.

* * * * *